United States Patent
Mouli et al.

(10) Patent No.: US 7,226,803 B2
(45) Date of Patent: Jun. 5, 2007

(54) PHOTODIODE WITH ULTRA-SHALLOW JUNCTION FOR HIGH QUANTUM EFFICIENCY CMOS IMAGE SENSOR AND METHOD OF FORMATION

(75) Inventors: Chandra Mouli, Boise, ID (US); Howard E. Rhodes, Boise, ID (US); Richard A. Mauritzson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/220,670

(22) Filed: Sep. 8, 2005

(65) Prior Publication Data

US 2006/0008938 A1 Jan. 12, 2006

Related U.S. Application Data

(62) Division of application No. 10/648,245, filed on Aug. 27, 2003.

(60) Provisional application No. 60/478,359, filed on Jun. 16, 2003.

(51) Int. Cl.
*H01L 31/101* (2006.01)
(52) U.S. Cl. .................. 438/59; 438/558; 257/E31.054
(58) Field of Classification Search .................. 438/59, 438/60, 71, 74, 513, 558, 563; 257/E31.01, 257/E31.012, E31.054, E31.055, E31.073
See application file for complete search history.

(56) References Cited

U.S. PATENT DOCUMENTS

| | | | |
|---|---|---|---|
| 4,151,008 A | 4/1979 | Kirkpatrick | |
| 4,861,729 A | 8/1989 | Fuse et al. | |
| 5,543,356 A * | 8/1996 | Murakami et al. | 438/548 |
| 5,877,072 A | 3/1999 | Andideh et al. | |
| 5,976,939 A | 11/1999 | Thompson et al. | |
| 5,993,766 A | 11/1999 | Tom et al. | |
| 6,103,580 A * | 8/2000 | Guo | 438/291 |
| 6,291,280 B1 * | 9/2001 | Rhodes | 438/199 |
| 6,380,012 B1 * | 4/2002 | Chen | 438/174 |
| 6,403,410 B1 | 6/2002 | Ohira et al. | |
| 6,433,366 B1 | 8/2002 | Takimoto et al. | |
| 6,706,550 B2 | 3/2004 | Lee et al. | |
| 6,731,397 B1 * | 5/2004 | Merrill et al. | 358/1.16 |
| 6,743,738 B2 | 6/2004 | Todd | |
| 6,893,907 B2 | 5/2005 | Maydan et al. | |
| 6,921,934 B2 | 7/2005 | Patrick | |
| 2001/0030333 A1 * | 10/2001 | Akatsu et al. | 257/269 |
| 2002/0167031 A1 * | 11/2002 | Francois | 257/293 |
| 2005/0001231 A1 * | 1/2005 | Hayashida et al. | 257/101 |

FOREIGN PATENT DOCUMENTS

EP 0 360 595 A2 3/1990

* cited by examiner

*Primary Examiner*—Carl Whitehead, Jr.
*Assistant Examiner*—Jennifer M Dolan
(74) *Attorney, Agent, or Firm*—Dickstein Shapiro LLP

(57) ABSTRACT

A pinned photodiode with an ultra-shallow highly-doped surface layer of a first conductivity type and a method of formation are disclosed. The ultra-shallow highly-doped surface layer has a thickness of about 100 Angstroms to about 500 Angstroms and a dopant concentration of about $5 \times 10^{17}$ atoms per $cm^3$ to about $1 \times 10^{19}$ atoms per $cm^3$. The ultra-shallow highly-doped surface layer is formed by diffusion of ions from a doped layer into the substrate or by a plasma doping process. The ultra-shallow pinned layer is in contact with a charge collection region of a second conductivity type.

27 Claims, 8 Drawing Sheets

US 7,226,803 B2

PHOTODIODE WITH ULTRA-SHALLOW JUNCTION FOR HIGH QUANTUM EFFICIENCY CMOS IMAGE SENSOR AND METHOD OF FORMATION

CROSS REFERENCE TO RELATED APPLICATIONS

The present application is a divisional of U.S. application Ser. No. 10/648,245, filed Aug. 27, 2003, the disclosure of which is herewith incorporated by reference in its entirety.

CROSS REFERENCE TO OTHER APPLICATIONS

This application claims priority to U.S. Provisional Patent Application No. 60/478,359 filed on Jun. 16, 2003 which is hereby incorporated by reference in its entirety.

FIELD OF THE INVENTION

The present invention relates to the field of semiconductor devices and, in particular, to improved photodiodes for high quantum efficiency.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

Because of the inherent limitations and expense of CCD technology, CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, photogate or photoconductor having a charge sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transfer.

In a conventional CMOS imager, the active elements of a pixel cell perform the necessary functions of: (1) photon to charge conversion; (2) accumulation of image charge; (3) transfer of charge to the floating diffusion node; (4) resetting the floating diffusion node to a known state before the transfer of charge to it; (5) selection of a pixel for readout; and (6) output and amplification of a signal representing pixel charge. The charge at the floating diffusion node is converted to a pixel output voltage by the source follower output transistor. The photosensitive element of a CMOS imager pixel is typically either a depleted p-n junction photodiode or a field induced depletion region beneath a photogate.

CMOS imaging circuits of the type discussed above are generally known and discussed in, for example, Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994), the disclosures of which are incorporated by reference herein.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned photodiode 11, shown in FIG. 2, formed as part of a p-n-p structure within a substrate 20. The pinned photodiode is termed "pinned" because the potential in the photodiode is pinned to a constant value when the photodiode is fully depleted. It should be understood, however, that the CMOS sensor pixel cell 10 may include a photogate, photoconductor or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

The charge accumulating region 21 is formed as a pinned p-n-p photodiode 11 which has a p-type layer 24, an n-type region 26 within the p-type substrate 20. The pinned photodiode 11 includes two p-type regions 20, 24 and the n-type photodiode region 26 which is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Generally, in CMOS image sensors such as the CMOS image sensor cell 10 of FIGS. 1–2, incident light causes electrons to collect in region 26. A maximum output signal, which is produced by the source follower transistor having gate 50, is proportional to the number of electrons to be extracted from the region 26. The maximum output signal increases with increased capacitance or acceptability of the region 26 to acquire electrons. The capacitance of pinned photodiode region typically depends on the doping concentration of impurities implanted into the active layer.

PNP photodiodes, such as the pinned photodiode 11 of FIG. 2, are becoming increasingly popular for high efficiency image sensors, particularly for image sensors operating at smaller wavelengths of the visible spectrum, for example, at the blue wavelength. Nevertheless, photodiodes for the blue spectrum are complex to design and have critical requirements for the potential barriers and wells located adjacent the transfer gate of the transfer transistor. This is partially because short-wavelength blue photons are absorbed closer to the surface of a substrate in a photodiode, as compared to either the red or green photons which are absorbed deeper.

In addition, the minority carriers in a blue pixel sensor cell are substantially more likely to be lost in recombination than the minority carriers formed in the red and green pixel sensor cells. The difference in the recombination rates is due to the relatively shallow penetration depths of the blue photons, the higher majority carrier concentration that exists in the n+ region 26 than in the substrate 20, and the depth of the junction. For example, even though the average penetration of a blue photon in a CMOS photodiode is approximately 0.2μ, a large number of blue photons fail to penetrate beyond the 0.1μ junction. This way, a large amount of these photons are lost to recombinations and the blue cell response remains substantially below the red cell and green cell responses. For these reasons, it is desirable for p-n junctions, such as the p-n junction between the p-type pinned layer 24 and the n-type region 26 of FIG. 2, to be very shallow.

In addition, it is desirable for the top surface layer (p-type) of the photodiode not to get depleted when the photodiode is pinned. In other words, the top surface layer should not get depleted when the main photodiode region gets depleted. This is to ensure that the leakage arising due to surface effects (defects, poor passivation, etc) do not contribute to the photodiode response characteristics. For example, surface defects occur as a result of transient-enhanced diffusion (TED) which, in turn, is the result of interstitials and extended defects due to implanted ions during implantation. Reducing the leakage arising due to the surface defects, particularly the TED defects, necessitates a high doping concentration in the top layer while, at the same time, maintaining a shallow junction.

There is needed, therefore, a shallow and highly concentrated pinned surface layer of a photodiode for an improved high blue response photosensor with suppressed transient-enhanced diffusion. There is also needed an active pixel photosensor for use in a CMOS imager that exhibits improved color separation, a better signal-to-noise ratio, minimized dark current and reduced cross-talk. A method of fabricating an active pixel photosensor exhibiting these improvements is also needed.

BRIEF SUMMARY OF THE INVENTION

In one aspect, the invention provides a pinned photodiode with an ultra-shallow pinned layer for maximized blue light absorption. The ultra-shallow pinned layer has a thickness of about 100 Angstroms to about 500 Angstroms, more preferably of about 100 Angstroms to about 300 Angstroms, and most preferably of about 250 Angstroms, and a dopant concentration of a first conductivity type of about $1 \times 10^{18}$ atoms per cm$^3$ to about $1 \times 10^{19}$ atoms per cm$^3$, more preferably of about $5 \times 10^{18}$ atoms per cm$^3$. The ultra-shallow pinned layer is in contact with a charge collection region of a second conductivity type.

In another aspect, the invention provides a method of improving the blue response in a photosensor by forming an ultra-shallow pinned surface layer of a first conductivity type of a pinned photodiode by a Solid Source Diffusion (SSD) technique. An in-situ doped film of the first conductivity type, for example a doped amorphous poly film or a BPSG oxide, is provided over an area of a substrate laterally displaced from an electrically active portion of a transfer gate of a pixel sensor cell. The in-situ doped film, formed to a thickness of about 100 Angstroms to about 1,000 Angstroms, is then annealed so that dopants from the in-situ doped film diffuse into the silicon substrate to form an ultra-shallow pinned surface layer. The ultra-shallow pinned layer has a thickness of about 100 Angstroms to about 500 Angstroms, more preferably of about 100 Angstroms to about 300 Angstroms, and most preferably of about 250 Angstroms, and a dopant concentration of about $1 \times 10^{18}$ atoms per cm$^3$ to about $1 \times 10^{19}$ atoms per cm$^3$, more preferably of about $5 \times 10^{18}$ atoms per cm$^3$. A doped region of a second conductivity type may be formed prior or subsequent to the formation of the ultra-shallow pinned surface layer, and in contact with the ultra-shallow pinned surface layer.

In another aspect, the invention provides a method of forming an ultra-shallow pinned surface layer of a first conductivity type of a pinned photodiode by another Solid Source Diffusion (SSD) technique. An undoped oxide is provided over an area of a substrate laterally displaced from an electrically active portion of a transfer gate of a pixel sensor cell. A very shallow implant with a dopant of a first conductivity type is then conducted to implant dopants of the first conductivity type into the undoped oxide layer to form a very shallow implanted oxide. The very shallow implanted oxide is then annealed so that dopants from the very shallow implanted oxide diffuse into the silicon substrate to form an ultra-shallow pinned surface layer. The ultra-shallow pinned layer has a thickness of about 100 Angstroms to about 500 Angstroms, more preferably of about 100 Angstroms to about 300 Angstroms, and most preferably of about 250 Angstroms, and has a dopant concentration of about $1 \times 10^{18}$ atoms per cm$^3$ to about $1 \times 10^{19}$ atoms per cm$^3$, more preferably of about $5 \times 10^{18}$ atoms per cm$^3$. A doped region of a second conductivity type may be formed prior or subsequent to the formation of the ultra-shallow pinned surface layer, and in contact with the ultra-shallow pinned surface layer.

In yet another aspect, the invention provides another Solid Source Diffusion (SSD) method of forming an ultra-shallow pinned surface layer of a first conductivity type of a pinned photodiode by gas source plasma doping (PD) of an area of a substrate laterally displaced from an electrically active portion of a transfer gate of a pixel sensor cell, where a photodiode is to be formed. The ultra-shallow pinned surface layer is formed by gas source PD with $B_2H_6$ or $BF_2$ plasma diluted by helium, and sustained by an electron cyclotron (ECR) or radio frequency (RF) plasma source for about 100 seconds. The ultra-shallow pinned surface layer has a thickness of about 100 Angstroms to about 500 Angstroms, more preferably of about 100 Angstroms to about 300 Angstroms, and most preferably of about 250 Angstroms, and a concentration of a first conductivity type of about $1 \times 10^{18}$ atoms per cm$^3$ to about $1 \times 10^{19}$ atoms per cm$^3$, more preferably of about $5 \times 10^{18}$ atoms per cm$^3$. A doped region of a second conductivity type may be formed prior or subsequent to the formation of the ultra-shallow pinned surface layer, and in contact with the ultra-shallow pinned surface layer.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Figure 9:
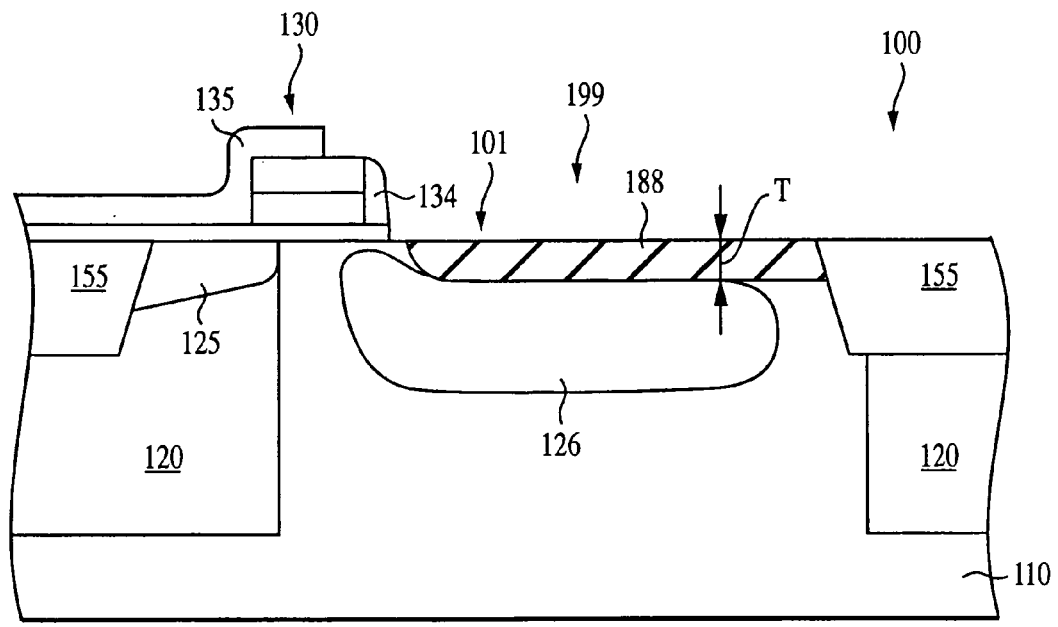
FIG. 9 is a schematic cross-sectional view of a CMOS image sensor pixel of FIG. 3 at a stage of processing subsequent to that shown in FIG. 8.
Figure 12:
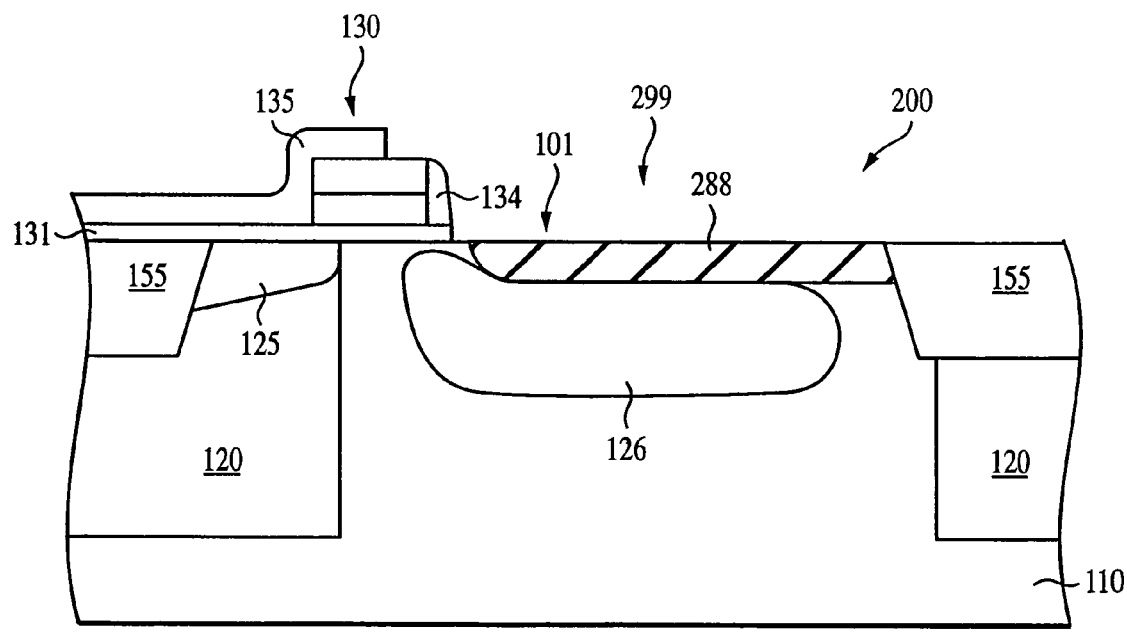
FIG. 12 is a schematic cross-sectional view of a CMOS image sensor pixel of FIG. 10 at a stage of processing subsequent to that shown in FIG. 11.
Figure 14:
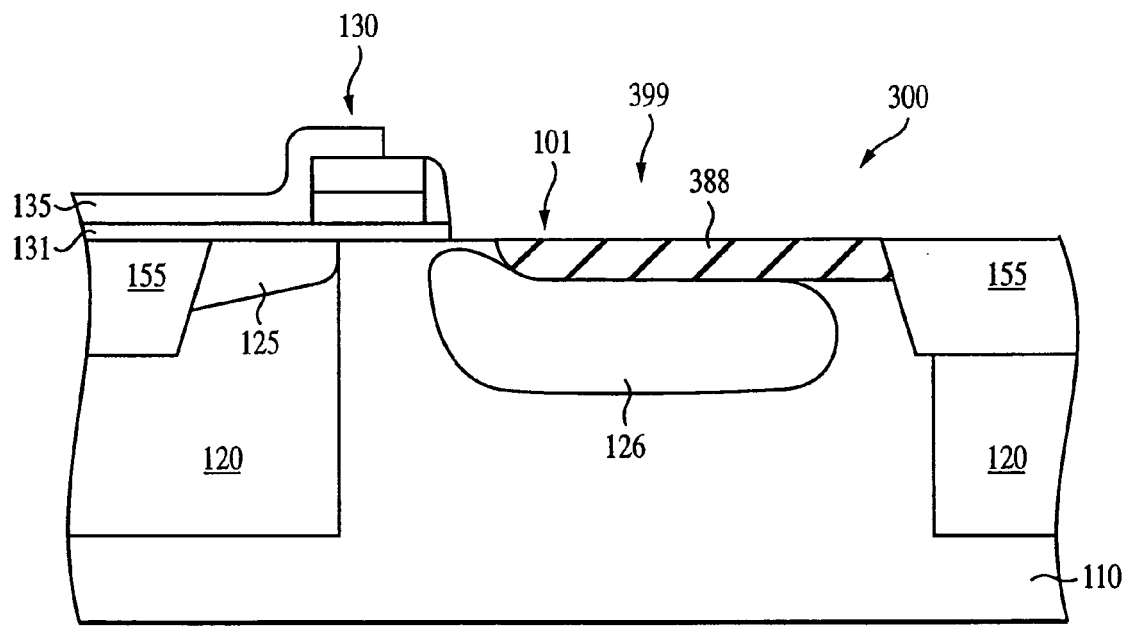
FIG. 14 is a schematic cross-sectional view of a CMOS image sensor pixel of FIG. 7 at a stage of processing subsequent to that shown in FIG. 13.

Referring now to the drawings, where like elements are designated by like reference numerals, FIGS. 9, 12 and 14 illustrate three exemplary embodiments of pixel sensor cells 100 (FIG. 9), 200 (FIG. 12) and 300 (FIG. 14) having respective pinned photodiodes 199, 299, 399 with respective pinned surface layers 188, 288, 388 laterally displaced from an active area of a gate structure 130 and over respective charge collection region 126.

It should be noted that, although the invention will be described below in connection with use in a four-transistor (4T) pixel cell, the invention has equal applicability to a three-transistor (3T) cell, a five-transistor (5T) cell or a six-transistor (6T) cell. Also, although the present invention will be described below with reference to pixel sensor cells 100 (FIG. 9), 200 (FIG. 12) and 300 (FIG. 14) having respective pinned photodiodes 199, 299, 399 as part of a CMOS imager, the invention has equal applicability to a photodiode, such as the photodiode 199, as part of a CCD imager.

Figure 1:
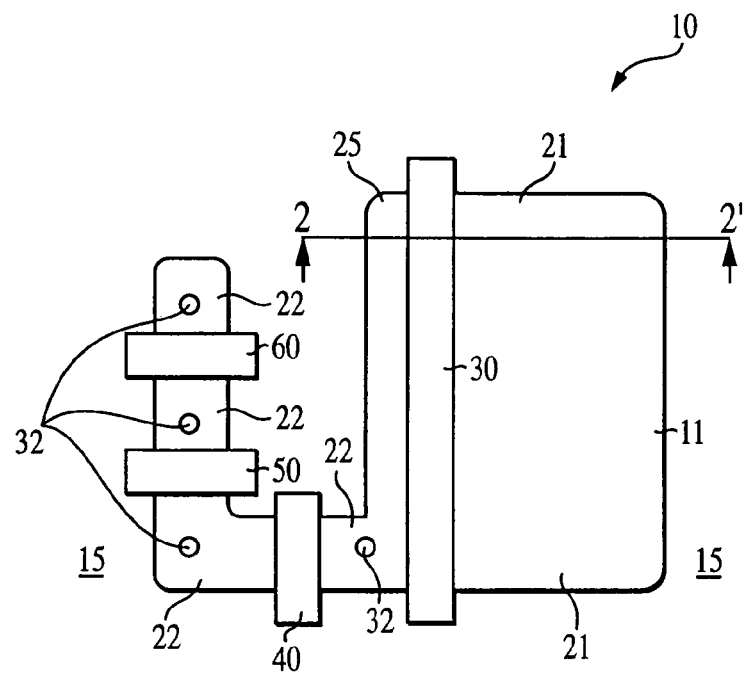
FIG. 1 is a top plan view of an exemplary CMOS image sensor pixel.
Figure 2:
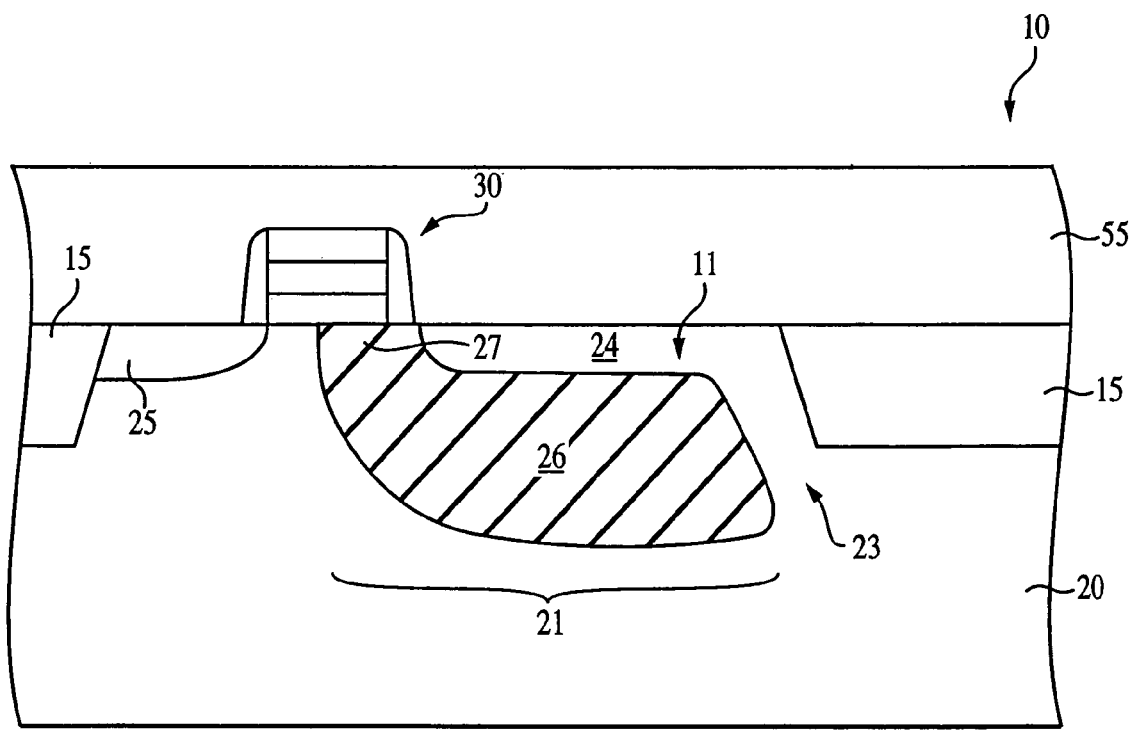
FIG. 2 is a schematic cross-sectional view of the CMOS image sensor of FIG. 1 taken along line 2–2'.
Figure 3:
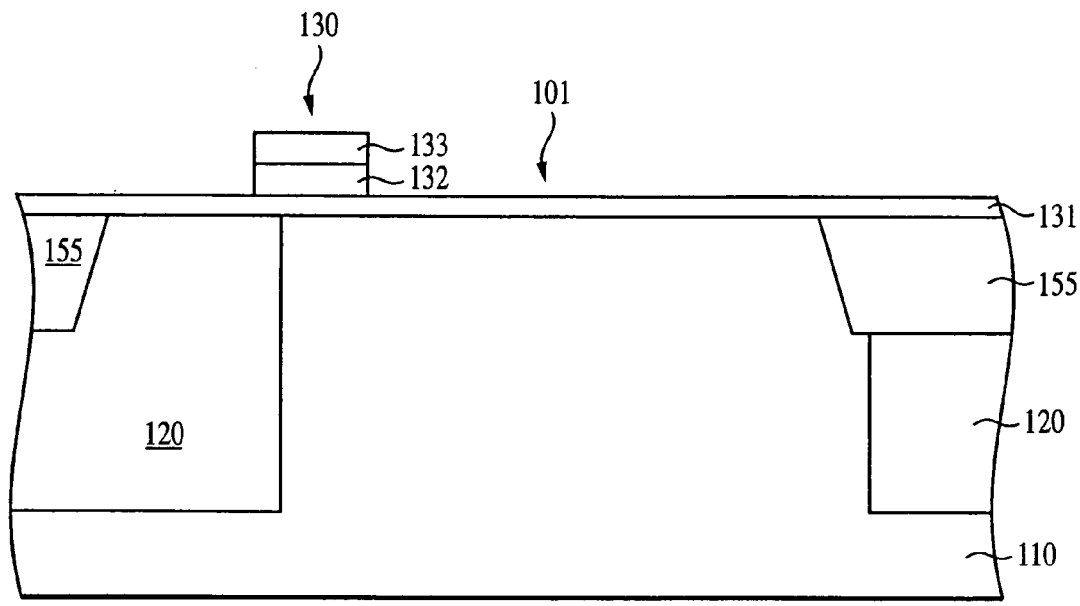
FIG. 3 is a schematic cross-sectional view of a CMOS image sensor pixel illustrating the fabrication of a pinned photodiode in accordance with the present invention and at an initial stage of processing.

The process for making the structures illustrated in FIG. 9 will now be described with reference to FIGS. 3–9. FIG. 3 illustrates a substrate 110 along a cross-sectional view which is the same view as in FIG. 2. For exemplary purposes, the substrate 110 is a silicon substrate slightly doped with a dopant of a first conductivity type, which for exemplary purposes, is p-type. However, as noted above, the invention has equal application to other semiconductor substrates. The dopant concentration in the p-type silicon substrate 110 is within the range of about $1 \times 10^{14}$ to about $1 \times 10^{16}$ atoms per $cm^3$, and is preferably within the range of about $5 \times 10^{14}$ to about $3 \times 10^{15}$ atoms per $cm^3$.

FIG. 3 also illustrates isolation regions 155 which are formed within the substrate 110 and are filled with a dielectric material, which may be an oxide material, for example a silicon oxide such as SiO or $SiO_2$, oxynitride, a nitride material such as silicon nitride, silicon carbide, a high temperature polymer, or other suitable dielectric materials. In a preferred embodiment, however, the isolation regions 155 are shallow trench isolation regions and the dielectric material is a high density plasma (HDP) oxide, a material which has a high ability to effectively fill narrow trenches. Thus, for simplicity, reference to the isolation regions 155 will be made in this application as to the shallow trench isolation regions 155. The shallow trench isolation regions 155 have a depth of about 1,000 to about 4,000 Angstroms, more preferably of about 2,000 Angstroms.

Also illustrated in FIG. 3 is a multi-layered transfer gate stack 130 formed over the silicon substrate 110. The transfer gate stack 130 comprises a first gate oxide layer 131 of grown or deposited silicon oxide on the silicon substrate 110, a conductive layer 132 of doped polysilicon or other suitable conductive material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

In addition and if desired, a silicide layer (not shown) may be also formed in the multi-layered gate stacks 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum suicide. This added conductive layer could also be a barrier layer/refractory metal such as TiN/W or $WN_x$/W or it could be entirely formed of $WN_x$.

A doped layer or well 120 of a first conductivity type, which for exemplary purposes is p-type, is also illustrated in FIG. 3. As known in the art, the p-type well 120 may be formed within the substrate 110 by implanting p-type dopants in the area of the substrate 110 directly beneath the active area of the pixel cell. The p-type well 120 may be formed subsequent to the formation of the shallow trench isolation (STI) 155 and of the gate stack 130. However, it must be understood that the p-type well 120 may be also formed prior to the formation of the shallow trench isolation (STI) 155 and/or gate stack 130. The dopant concentration in the p-type well 120 is higher than the dopant concentration of the silicon substrate 110 and within the range of about $1 \times 10^{16}$ to about $1 \times 10^{18}$ atoms per cm$^3$, and is preferably within the range of about $5 \times 10^{16}$ to about $5 \times 10^{17}$ atoms per cm$^3$.

Figure 4:
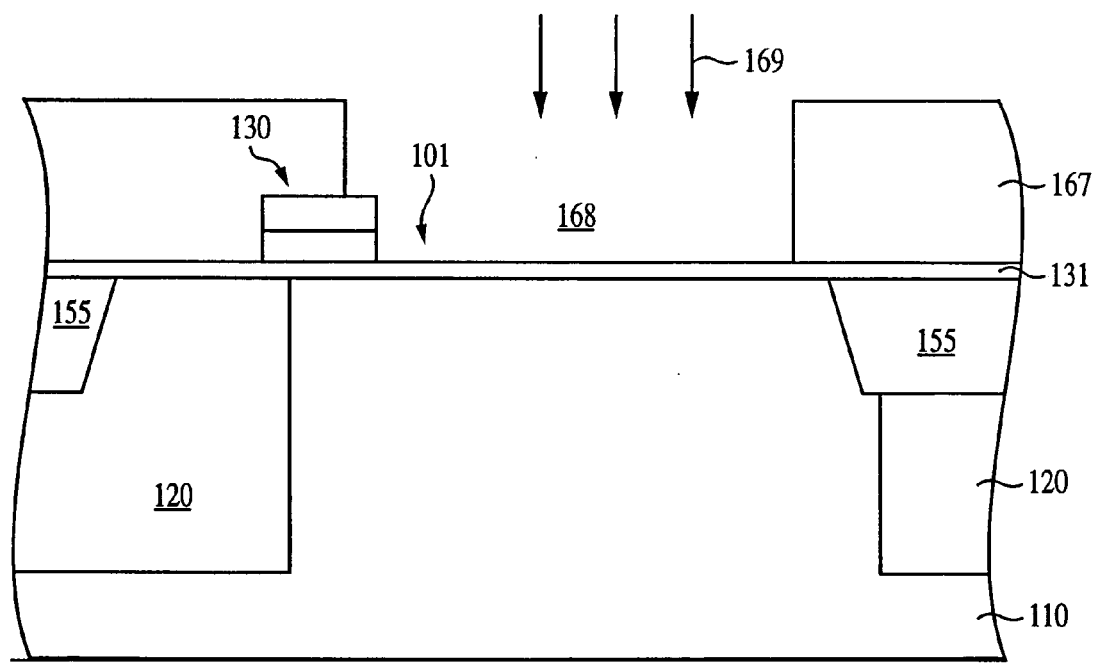
FIG. 4 is a schematic cross-sectional view of a CMOS image sensor fragment of FIG. 3 at a stage of processing subsequent to that shown in FIG. 3.

Subsequent to the formation of the STI regions 155 and of the transfer gate 130, a first photoresist layer 167 is next formed over the structure of FIG. 3 to a thickness of about 1,000 Angstroms to about 20,000 Angstroms, as shown in FIG. 4. The first photoresist layer 167 is patterned to obtain a first opening 168 over photodiode area 101 of the substrate 110 between about the edge of the gate structure 130 and the isolation region 155 where a charge accumulation region of a photodiode is to be formed. As illustrated in FIG. 4, the first photoresist layer 167 is patterned so that, on one side of the opening 168, the first photoresist layer 177 completely overlaps the isolation region 155 by about 0.3 µm. On the other side of the opening 168, the first photoresist layer 167 is approximately 0.61 µm from the edge of the gate structure 130.

Figure 5:
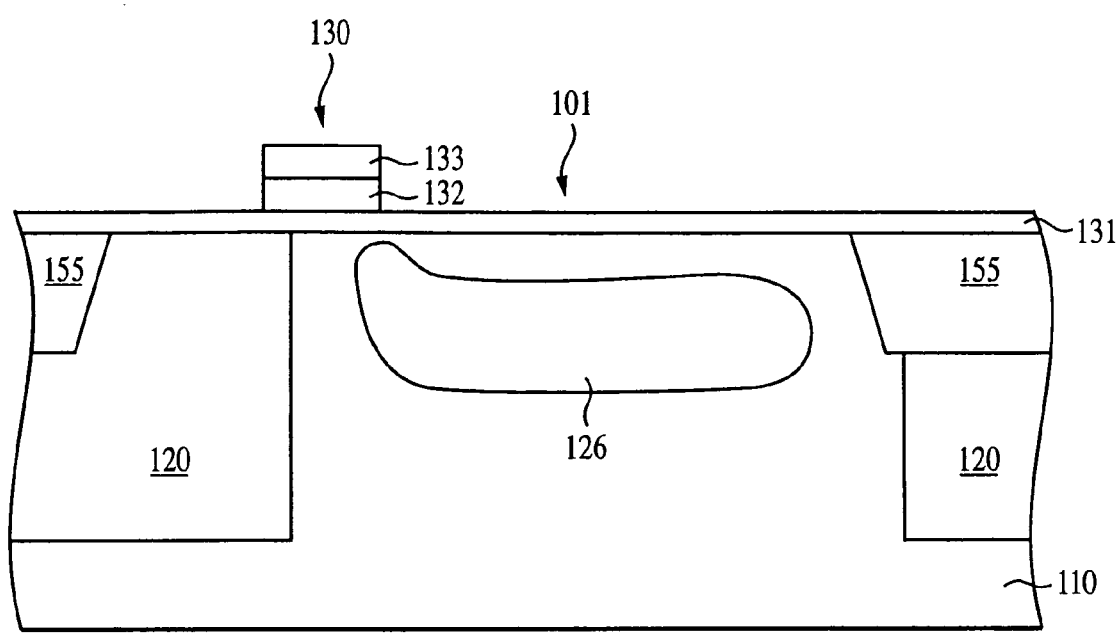
FIG. 5 is a schematic cross-sectional view of a CMOS image sensor pixel of FIG. 3 at a stage of processing subsequent to that shown in FIG. 4.

A first dopant implantation 169 (FIG. 4) using a dopant of a second conductivity type, which for exemplary purposes is n-type, is conducted to implant ions through the first opening 168 (FIG. 4) in the photodiode area 101 of the substrate 110 directly beneath the active area of the pixel cell to form an n-type region 126, as illustrated in FIG. 5. The implanted n-doped region 126 forms a photosensitive charge storage region for collecting photogenerated electrons.

The first dopant implantation 169 (FIG. 4) may be conducted by placing the substrate 110 in an ion implanter, and implanting appropriate n-type dopant ions through the first opening 168 (FIG. 4) into the substrate 110 at an energy of 30 keV to 500 keV to form n-doped region 126. As illustrated in FIG. 4, n-type dopants such as arsenic, antimony, or phosphorous may be implanted into the substrate 110 so that the dopant concentration in the n-doped region 126 (FIG. 5) is within the range of about $3 \times 10^{15}$ to about $1 \times 10^{18}$ atoms per cm$^3$, preferably within the range of about $1 \times 10^{16}$ to about $5 \times 10^{16}$ atoms per cm$^3$. If desired, multiple energy implants may be also used to tailor the profile of the n-doped region 126. In addition, an angled implantation (implantation at angles other than 0 degrees, where 0 degrees is defined as perpendicular to the surface of the silicon substrate 110) may be also conducted to form the n-doped region 126.

Subsequent to the first dopant implantation 169 (FIG. 4), the first photoresist layer 167 is removed by conventional techniques, such as oxygen plasma for example. The structure at this point is depicted in FIG. 5.

Figure 6:
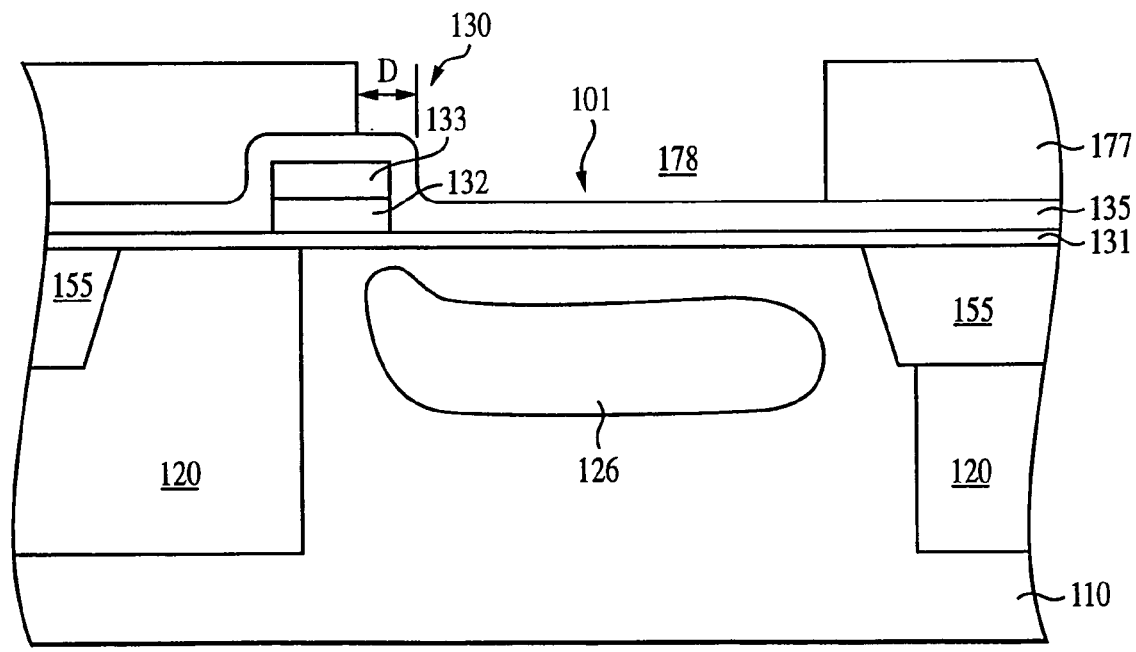
FIG. 6 is a schematic cross-sectional view of a CMOS image sensor pixel of FIG. 3 at a stage of processing subsequent to that shown in FIG. 5.

An insulating layer 135 is next formed over the substrate 110 including the STI regions 155, the transfer gate 130 and the gate oxide layer 131, as shown in FIG. 6. The insulating layer 135 may be preferably an oxide, such as silicon dioxide, silicon nitride, silicon oxynitride, ON, NO, ONO or TEOS, among others. The insulating layer 135 may be formed by a deposition method and to a thickness of about 100 Angstroms to about 1,500 Angstroms, more preferably of about 400 Angstroms to about 1,000 Angstroms.

A second photoresist layer 177 (FIG. 6) is next formed over the insulating layer 135 to a thickness of about 1,000 Angstroms to about 20,000 Angstroms. The second photoresist layer 177 (FIG. 6) is patterned with a mask to obtain a second opening 178 so that, on one side of the second opening 178, the second photoresist layer 177 extends over the STI region 155 (the right most STI region in FIG. 6), without completely covering the STI region 155. On the other side of the second opening 178, the second photoresist layer 177 extends over the gate 130 but does not cover the gate 130 by a predetermined offset distance D (FIG. 6) from the sidewall of the insulating layer 132 over the gate structure 130. The offset distance D (FIG. 6) may be of about 0 Angstroms to about 3,000 Angstroms, more preferably of about 300 Angstroms to about 2,000 Angstroms.

Subsequent to the formation of the second opening 178, a dry etch is conducted to etch portions of the gate oxide layer 131 and of the insulating layer 135 located above the photodiode area 101 and within the second opening 178. The dry etch is conducted to clean the surface of the substrate 110 of any residue or non-uniform native oxides which can prevent a uniform diffusion of dopants into the silicon substrate 110. If desired, an argon plasma or a fluorinated plasma may be employed in addition to the dry etch, as a precautionary measure for the removal of impurities and/or any native oxide from the silicon surface. At the end of the dry etching step, sidewall spacer 134 is formed only on one sidewall of gate stack 130, as shown in FIG. 7.

Figure 7:
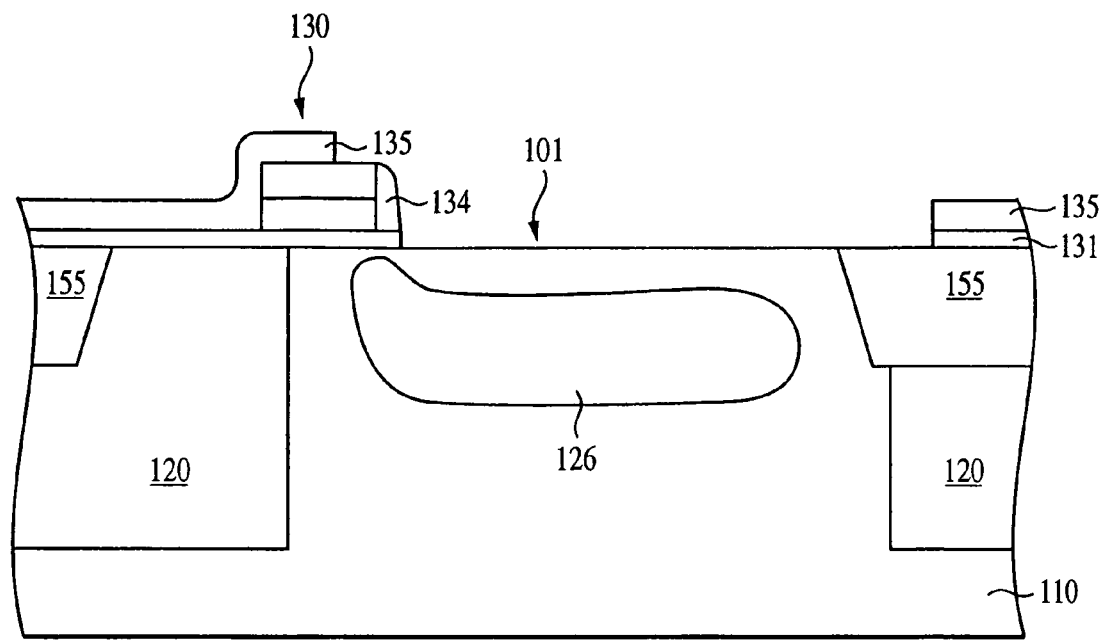
FIG. 7 is a schematic cross-sectional view of a CMOS image sensor pixel of FIG. 3 at a stage of processing subsequent to that shown in FIG. 6.

Subsequent to the removal of the second photoresist layer 177, an in-situ doped layer 180 of the first conductivity type, which for exemplary embodiments is p-type, is next formed over the structure of FIG. 7 as part of the first Solid Source Diffusion (SSD) technique of the present invention. As discussed below, the in-situ doped layer 180 of FIG. 8 will act as a p-type dopant source for the out-diffusion of p-type dopants from the in-situ doped layer 180 and into the photodiode area 101 of the silicon substrate 110. The in-situ doped layer 180 may comprise p+ polysilicon, BPSG oxide, BSG oxide, or other doped materials. For example, if BSG is employed, then the BSG in-situ doped layer 180 may be provided with a boron concentration of about 1% to about 12% and formed to a thickness of about 100 Angstroms to about 1,000 Angstroms, more preferably of about 250 Angstroms. The in-situ doped layer 180 may be formed by a conventional deposition process, such as a low pressure chemical vapor deposition, and at a temperature of about 400° C. to about 600° C.

Figure 8:
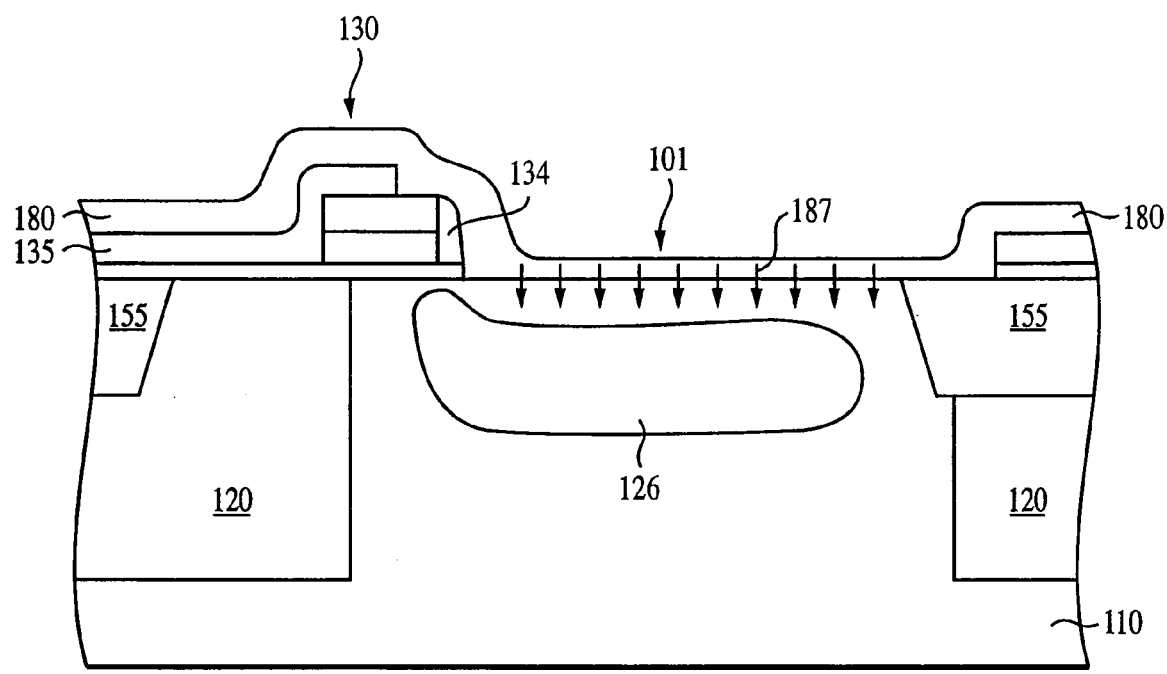
FIG. 8 is a schematic cross-sectional view of a CMOS image sensor pixel of FIG. 3 at a stage of processing subsequent to that shown in FIG. 7.

Referring still to FIG. 8, an anneal or driving step 187 is next conducted to diffuse the p-type dopants from the in-situ doped layer 180 into the photodiode area 101 of the silicon substrate 110. In this manner, p-type boron dopants from a BSG doped layer 180, for example, are driven in the area of the substrate directly beneath the active area of the pixel cell and laterally displaced from the gate stack 130, to form an ultra-shallow p-type pinned layer 188, as shown in FIG. 9. The anneal 187 (FIG. 8) may be conducted at a temperature of about 900° C. to about 1100° C. and for about 10 seconds to about 20 seconds, more preferably of about 950° C. to about 1000° C. and for about 10 seconds to about 20 seconds.

The ultra-shallow p-type pinned surface layer 188 (FIG. 9) has a thickness T (FIG. 9) of about 100 Angstroms to about 500 Angstroms, more preferably of about 100 Angstrom to about 300 Angstroms, and most preferably of about 250 Angstroms. Thus, for the purposes of the present invention the term "ultra-shallow pinned layer" is defined as a pinned buried layer having a thickness of about 100 Angstroms to about 500 Angstroms, more preferably of about 100 Angstrom to about 300 Angstroms, and most preferably of about 250 Angstroms. The dopant concentration in the ultra-shallow p-type pinned surface layer 188 (FIG. 9) is within the range of about $5 \times 10^{17}$ atoms per $cm^3$ to about $1 \times 10^{19}$ atoms per $cm^3$, more preferably of about $1 \times 10^{18}$ atoms per $cm^3$ to about $5 \times 10^{18}$ atoms per $cm^3$.

By out-diffusing the p-type dopants from the in-situ doped layer 180 below the silicon surface and into the silicon substrate, the p-type pinned surface layer 188 is formed to a very high dopant concentration and with a minimum thickness. This way, a very shallow PN junction is formed between the ultra-shallow p-type pinned surface layer 188 and the n-type region 126 which allows for maximized blue response in a photosensor.

Subsequent to the anneal 187, the in-situ doped layer 180 is removed by conventional techniques to complete the formation of p-n-p photodiode 199 formed by regions 188, 126 and p-type substrate 110, as illustrated in FIG. 9. A floating diffusion region 125 is also formed opposite the charge collection region 126 and adjacent the gate structure 130 by known methods in the art.

The devices of the pixel sensor cell 100 including the reset transistor, the source follower transistor and row select transistor are then formed by well-known methods. Conventional processing steps may be also employed to form contacts and wiring to connect gate lines and other connections in the pixel cell 100. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 10:
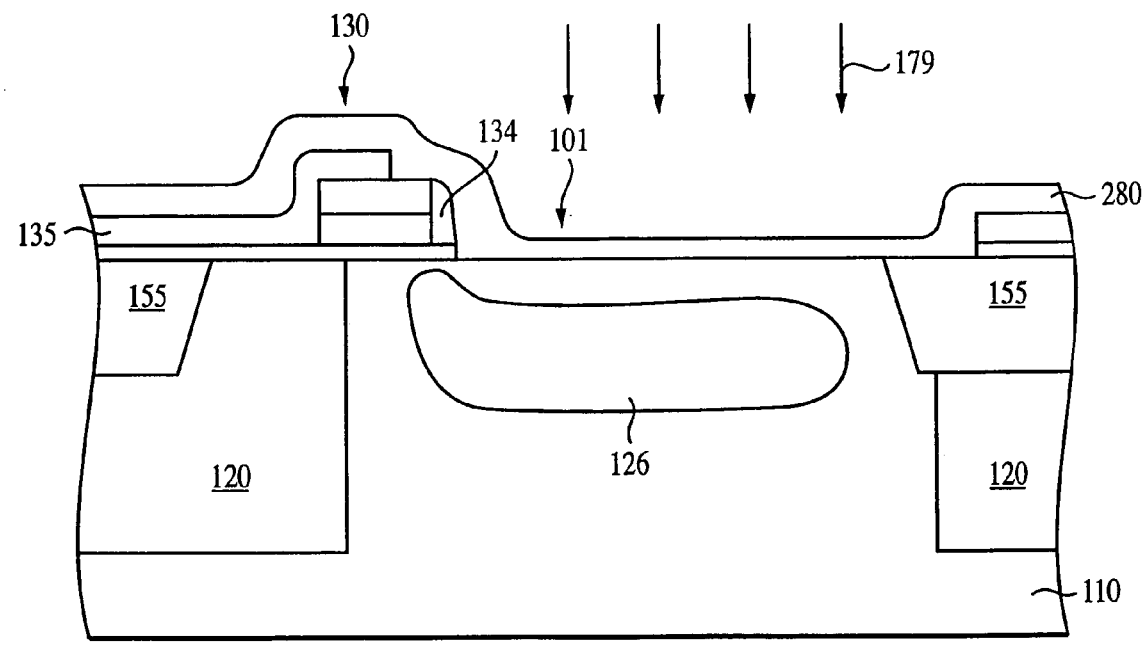
FIG. 10 is a schematic cross-sectional view of a CMOS image sensor pixel of FIG. 7 at a stage of processing subsequent to that shown in FIG. 7 and in accordance with a second embodiment of the present invention.
Figure 11:
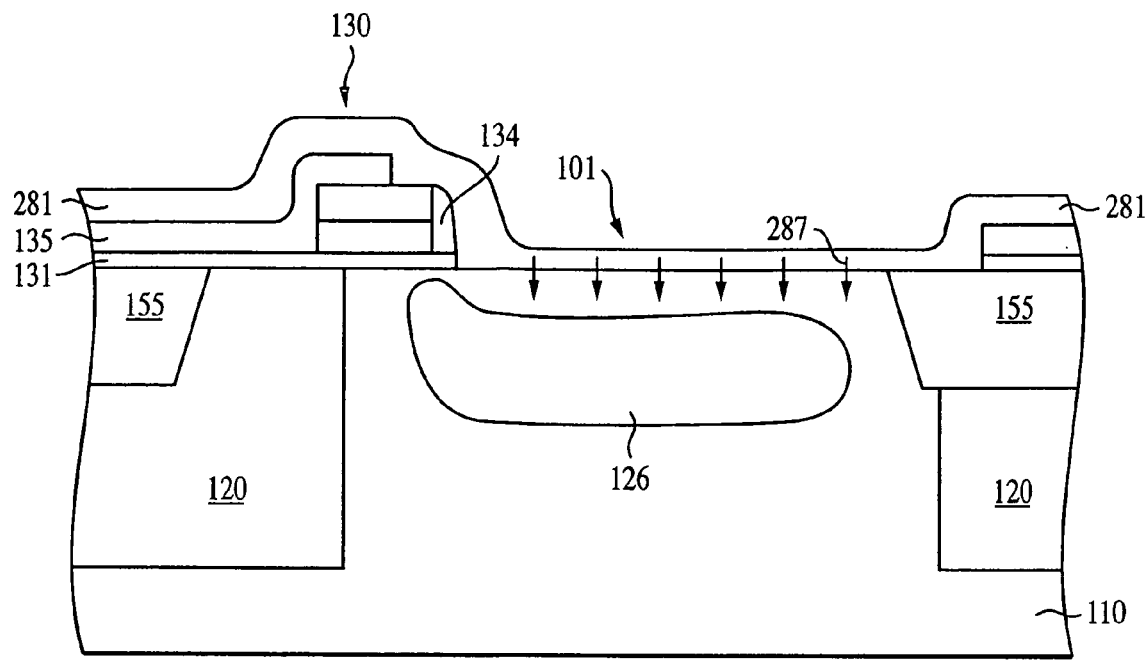
FIG. 11 is a schematic cross-sectional view of a CMOS image sensor pixel of FIG. 10 at a stage of processing subsequent to that shown in FIG. 10.

FIGS. 10–12 illustrate yet another embodiment of the present invention according to which ultra-shallow p-type pinned layer 288 (FIG. 12) is formed by diffusion of dopants of a first conductivity type from a very shallow implanted oxide and into the silicon substrate. The structure of FIG. 10 is similar in part to the structure of FIG. 8 to the extent that the in-situ doped layer 180 of the first embodiment is substituted with an undoped oxide layer 280 (FIG. 10) in the second embodiment. The undoped oxide layer 280 may be formed of any undoped oxide material, for example, an undoped silicon oxide or an undoped silicon nitride, to a thickness of about 100 Angstroms to about 1,000 Angstroms, more preferably of about 600 Angstroms. The undoped oxide layer 280 may be formed by a conventional deposition process, such as a low pressure chemical vapor deposition, and at a temperature of about 400° C. to about 600° C.

The undoped oxide layer 280 is next subjected to a very shallow implant 179 (FIG. 10) for implanting p-type ions, such as boron, beryllium, indium or magnesium, into an area of the substrate 110 located right below the substrate surface and laterally displaced from the gate structure 130, as shown in FIG. 10. The p-type dopant ions are implanted into the substrate 110 at a very low energy, of less than about 1 keV, to form p-type doped oxide layer 281, shown in FIG. 11. The dopant concentration in the p-type doped oxide layer 281 is within the range of about $1 \times 10^{19}$ to about $1 \times 10^{21}$ atoms per $cm^3$, more preferably of about $5 \times 10^{19}$ to about $5 \times 10^{20}$ atoms per $cm^3$.

The p-type doped oxide layer 281 (FIG. 11) is then subjected to an anneal or driving step to allow diffusion 287 of the p-type dopants from the p-type doped layer 281 into an area of the substrate directly beneath the active area of the pixel cell and laterally displaced from the gate stack 130, to form an ultra-shallow p-type pinned layer 288, as shown in FIG. 12. The anneal may be conducted at a temperature of about 900° C. to about 1100° C. and for about 10 seconds to about 20 seconds, more preferably of about 950° C. to about 1000° C. and for about 10 seconds to about 20 seconds.

The ultra-shallow p-type pinned surface layer 288 (FIG. 12) is formed to a thickness of about 100 Angstroms to about 500 Angstroms, more preferably of about 100 Angstroms to about 300 Angstroms, and most preferably of about 250 Angstroms. The dopant concentration in the ultra-shallow p-type pinned surface layer 288 (FIG. 12) is within the range of about $5 \times 10^{17}$ atoms per $cm^3$ to about $1 \times 10^{19}$ atoms per $cm^3$, more preferably of about $1 \times 10^{18}$ atoms per $cm^3$ to about $5 \times 10^{18}$ atoms per $cm^3$. As in the previous embodiment, a very shallow PN junction is formed between the ultra-shallow p-type pinned surface layer 288 and the n-type region 126 which maximizes the blue response in photodiode 299 (FIG. 12).

Figure 13:
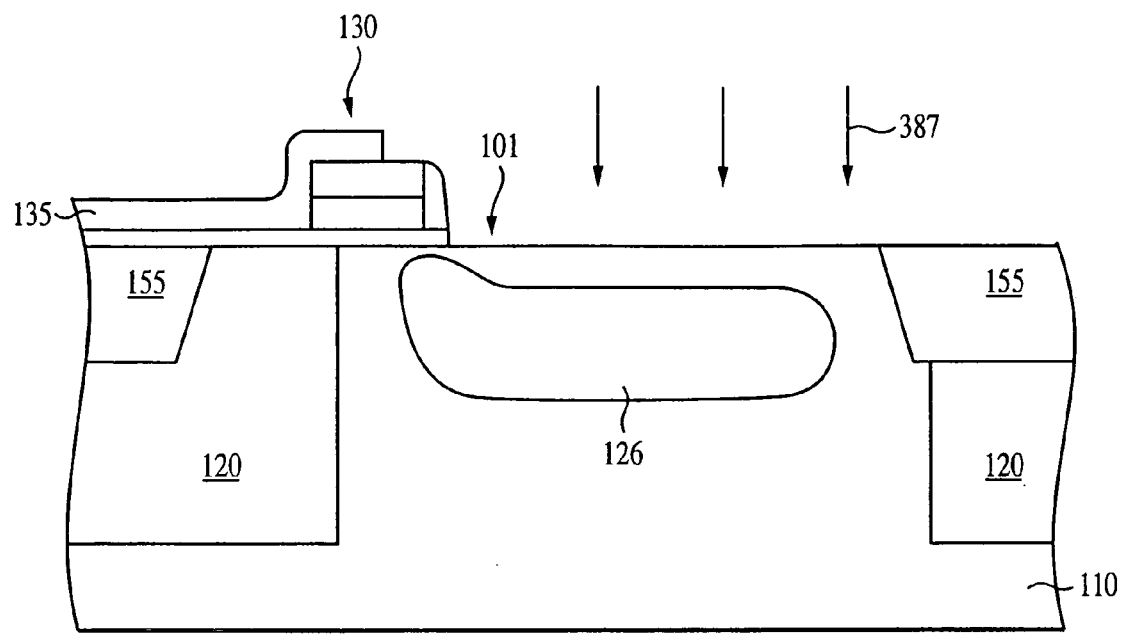
FIG. 13 is a schematic cross-sectional view of a CMOS image sensor pixel of FIG. 7 at a stage of processing subsequent to that shown in FIG. 7 and in accordance with a third embodiment of the present invention.

FIGS. 13–14 illustrate the formation of an ultra-shallow p-type pinned layer 388 by conducting a gas source plasma doping (PD) process as part of the Solid Source Diffusion (SSD) technique. According to this embodiment, gas source plasma doping 387 (FIG. 13) may be conducted in a $B_2H_6$ or $BF_2$ plasma diluted by an inert gas such as helium and sustained by an electron cyclotron (ECR) or radio frequency (RF) plasma source, for about 100 seconds. During the plasma doping process, boron dopants are driven into an area of the substrate directly beneath the active area of the pixel cell and laterally displaced from the gate stack 130, to form an ultra-shallow pinned surface layer 388 (FIG. 14) and complete the formation of photodiode 399 (FIG. 14). The ultra-shallow pinned surface layer 388 is formed to a thickness of about 100 Angstroms to about 500 Angstroms, more preferably of about 100 Angstroms to about 300 Angstroms, and most preferably of about 250 Angstroms, and a dopant concentration of a first conductivity type of about $5 \times 10^{17}$ atoms per $cm^3$ to about $1 \times 10^{19}$ atoms per $cm^3$, more preferably of about $1 \times 10^{18}$ atoms per $cm^3$ to about $5 \times 10^{18}$ atoms per $cm^3$.

In each of the three embodiments detailed above, the ultra-shallow pinned layer 188, 288, 388 has a high concentration while maintaining a shallow junction. These characteristics ensure that the leakage due to surface defects, particularly leakage due to, transient-enhanced diffusion (TED), is suppressed in the photodiode. As known in the art, TED occurs due to defects created during implantation. Implanted ions generate interstitials and extended defects. These interstitials tend to cluster around the (311) crystal plane due to their thermodynamic stability. During a subsequent heat step, these interstitials get liberated from the (311) planes and tend to increase diffusion of implanted ions due to coupled-diffusion effects. By utilizing Solid-Source Diffusion (SSD) techniques to form the ultra-shallow pinned layer 188, 288, 388 of the present invention, TED is suppressed since there are little or no (311) defects. Thus, the present invention provides methods of forming optimized photodiodes using SSD techniques to control the junction depths and suppress the transient-enhanced diffusion.

Although the above embodiments have been described with reference to the formation of a buried p-n-p photodiode, such as the p-n-p photodiodes 199 (FIG. 9), 299 (FIG. 12) and 399 (FIG. 14) having an n-type charge collection region formed adjacent respective pinned layers 188, 288, 388, it must be understood that the invention is not limited to this embodiment. Accordingly, the invention has equal applicability to n-p-n photodiodes comprising an ultra-shallow buried n-type pinned layer. Of course, the dopant and conductivity type of all structures will change accordingly, with the transfer gate corresponding to a PMOS transistor.

In addition, although the embodiment of FIG. 12–14 has been described above with reference to the formation of ultra-shallow p-type pinned layer 388 by a gas source plasma doping, the invention is not limited to this embodiment and contemplates the formation of an ultra-shallow p-type pinned layer by other plasma doping methods as known in the art, for example, by a solid source plasma doping or a high temperature rapid vapor doping (RVD), among others.

Further, although the embodiments of the present invention have been described above with reference to the formation of an ultra-shallow p-type pinned layer by three different and independent methods, the invention is not limited to these embodiments. Accordingly, the present invention also contemplates the formation of an ultra-shallow p-type pinned layer by a combination of at least two of the above-identified three methods. For example, the invention also contemplates the formation of an ultra-shallow p-type pinned layer by a combination of a solid diffusion coupled with a very shallow low dose implantation.

Although the invention has been described above with reference to pinned photodiodes 199, 299, 399 with respective ultra-shallow pinned surface layers 188, 288, 388 as part of a four-transistor (4T) pixel cell, the invention also has applicability to a three-transistor (3T) cell which differs from the 4T cell in the omission of the transfer transistor. In this case, the photocollection region is electrically connected to the gate of the source follower transistor. A pinned photodiode with an ultra-shallow pinned surface layer as part of a 5T, 6T or a 7T cell, among others, is also contemplated by the present invention.

Additionally, although the present invention has been described above with reference to a 4T pixel cell as part of a CMOS imager, the invention has equal applicability to a photodiode with an ultra-shallow pinned surface layer as part of a CCD imager.

Figure 15:
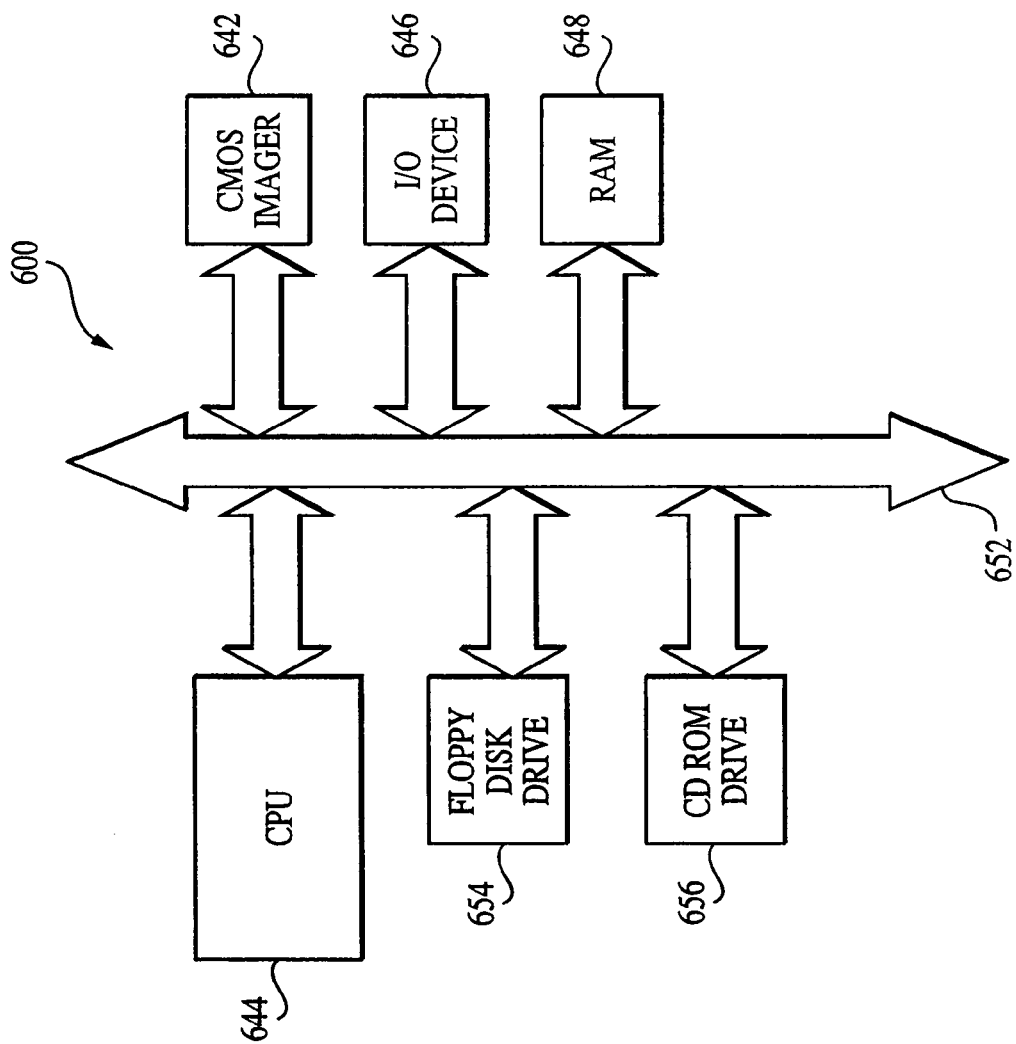
FIG. 15 illustrates a schematic diagram of a computer processor system incorporating a CMOS image sensor fabricated according to the present invention.

A typical processor based system 600, which has a connected CMOS imager having an array of pixels constructed according to the invention is illustrated in FIG. 15. A processor based system is exemplary of a system having digital circuits which could include CMOS imagers. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS imager 642 communicates with the system over bus 652. The computer system 600 also includes random access memory (RAM) 648, and may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

The invention claimed is:

1. A method of forming a photodiode, said method comprising:
    forming at least one shallow trench isolation region in a silicon substrate of a first conductivity type;
    forming a transistor gate over said silicon substrate and spaced apart from said at least one shallow trench isolation region;
    forming an implanted well region of said first conductivity type located below at least a portion of said transistor gate and extending to only one side of said transistor gate;
    forming an ultra-shallow first doped layer of said first conductivity type below a surface of said silicon substrate and laterally displaced from said implanted well region on an opposite side of said transistor gate from said implanted well region, said ultra-shallow first doped layer having a dopant concentration within the range of from about $5\times10^{17}$ atoms per cm$^3$ to about $1\times10^{19}$ atoms per cm$^3$; and
    forming a doped region of a second conductivity type in said silicon substrate and below and in contact with said ultra-shallow first doped layer.

2. The method of claim 1, wherein said first doped layer has a dopant concentration of about $1\times10^{18}$ atoms per cm$^3$ to about $5\times10^{18}$ atoms per cm$^3$.

3. The method of claim 1, wherein said doped region has a dopant concentration within the range of from about $3\times10^{15}$ to about $1\times10^{18}$ atoms per cm$^3$.

4. The method of claim 1, wherein said act of forming said ultra-shallow first doped layer further comprises forming an in-situ doped layer of said first conductivity type over a first area of said substrate.

5. The method of claim 4, wherein said act of forming said ultra-shallow first doped layer further comprises diffusing ions from said in-situ doped layer into said first area of said substrate.

6. The method of claim 5, wherein said act of diffusing said ions from said in-situ doped layer further comprises annealing said in-situ doped layer at a temperature of about 900° C. to about 1100° C.

7. The method of claim 6, wherein said act of annealing said in-situ doped layer is conducted for about 10 seconds to about 20 seconds.

8. The method of claim 6, wherein said act of annealing said in-situ doped layer is conducted at a temperature of about 950° C. to about 1000° C. and for about 10 seconds to about 20 seconds.

9. The method of claim 1, wherein said act of forming said ultra-shallow first doped layer further comprises forming an undoped oxide layer over a second area of said substrate.

10. The method of claim 9, wherein said act of forming said ultra-shallow first doped layer further comprises implanting ions of said first conductivity type in said undoped oxide layer to form a doped oxide layer.

11. The method of claim 10, wherein said act of forming said ultra-shallow first doped layer further comprises diffusing ions from said doped oxide layer into said second area of said substrate to form said first doped layer.

12. The method of claim 11, wherein said act of diffusing said ions from said doped oxide layer further comprises annealing said doped oxide layer at a temperature of about 900° C. to about 1100° C.

13. The method of claim 12, wherein said act of annealing said doped oxide layer is conducted for about 10 seconds to about 20 seconds.

14. The method of claim 12, wherein said act of annealing said doped oxide layer is conducted at a temperature of about 950° C. to about 1000° C. and for about 10 seconds to about 20 seconds.

15. The method of claim 1, wherein said act of forming said ultra-shallow first doped layer further comprises conducting a gas source plasma doping in a third area of said substrate.

16. The method of claim 15, wherein said gas source plasma doping is conducted in a $B_2H_6$ plasma diluted by another gas.

17. The method of claim 16, wherein said another gas is helium.

18. The method of claim 15, wherein said gas source plasma doping is conducted in a $BF_2$ plasma diluted by another gas.

19. The method of claim 18, wherein said another gas is helium.

20. The method of claim 15, wherein said gas source plasma doping is conducted in an electron cyclotron (ECR) for about 100 seconds.

21. The method of claim 15, wherein said gas source plasma doping is conducted in a radio frequency (RF) plasma source for about 100 seconds.

22. The method of claim 1, wherein said transistor gate is part of one of a 3T, 4T, 5T, 6T or 7T pixel sensor cell.

23. The method of claim 1, wherein said transistor gate is part of a CMOS imager.

24. The method of claim 1, wherein said transistor gate is part of a CCD imager.

25. The method of claim 1, wherein said implanted well region is formed prior to the formation of said at least one shallow trench isolation region.

26. The method of claim 1, wherein said implanted well region is formed subsequently to the formation of said at least one shallow trench isolation region.

27. The method of claim 1, wherein said implanted well region is further formed below at least a portion of said at least one shallow trench isolation region.

* * * * *

UNITED STATES PATENT AND TRADEMARK OFFICE
CERTIFICATE OF CORRECTION

PATENT NO. : 7,226,803 B2 Page 1 of 1
APPLICATION NO. : 11/220670
DATED : June 5, 2007
INVENTOR(S) : Chandra Mouli et al.

It is certified that error appears in the above-identified patent and that said Letters Patent is hereby corrected as shown below:

Column 2, line 40, "preferable" should read --preferably--;

Column 7, line 48, "0.61 μm" should read --0.6 μm--; and

Column 9, line 22, "Angstrom" should read --Angstroms--.

Signed and Sealed this

Fourth Day of September, 2007

JON W. DUDAS
*Director of the United States Patent and Trademark Office*